United States Patent [19]
Fishley et al.

[11] Patent Number: 5,786,631
[45] Date of Patent: Jul. 28, 1998

[54] CONFIGURABLE BALL GRID ARRAY PACKAGE

[75] Inventors: Clifford R. Fishley, San Jose; Michael L. Lofstedt, Tracy, both of Calif.

[73] Assignee: LSI Logic Corporation, Milpitas, Calif.

[21] Appl. No.: 539,188

[22] Filed: Oct. 4, 1995

[51] Int. Cl.$^6$ ............................................. H01L 23/12
[52] U.S. Cl. ..................................... 257/701; 257/787
[58] Field of Search ............................ 257/787, 780, 257/790, 701

[56] References Cited

U.S. PATENT DOCUMENTS

| | | | |
|---|---|---|---|
| 5,386,342 | 1/1995 | Rostoker | 257/790 |
| 5,547,730 | 8/1996 | Weiblen et al. | 257/790 |

FOREIGN PATENT DOCUMENTS 5-283593  10/1993  Japan .

*Primary Examiner*—Tom Thomas
*Assistant Examiner*—Roy Potter
*Attorney, Agent, or Firm*—Luedeka, Neely & Graham, P.C.

[57] ABSTRACT

A configurable package for mounting an integrated circuit to a circuit board. The package has a substrate for receiving the integrated circuit. On the substrate are contacts for making electrical connections between the substrate and the integrated circuit. The substrate also has solder balls for making electrical connections between the substrate and the circuit board. Each one of the contacts is in electrical contact with one each of the solder balls. A clip ring/dam ring overlays and attaches to the substrate. The clip ring/dam ring forms a reservoir for receiving the integrated circuit on the substrate. Also, formed at the periphery of the clip ring/dam ring, are clamping tabs. The reservoir can be filled with an encapsulating material, such as epoxy, to complete the package. A lid is provided for covering the integrated circuit. A clip overlays the lid and releasably attaches to the clamping tabs of the insert, and retains the lid to the insert. The lid may have fins formed in it, to act as a heat sink, and dissipate heat by convection to air flowing within the environment.

19 Claims, 7 Drawing Sheets

CONFIGURABLE BALL GRID ARRAY PACKAGE

FIELD OF THE INVENTION

The present invention relates to the field of integrated circuit packages, and more particularly to surface mount packages for integrated circuits.

BACKGROUND OF THE INVENTION

Integrated circuits, which are formed on a monolithic semiconductor or ceramic substrate, generate heat during operation. Although they typically do not draw a relatively large amount of current, they are often so small in terms of surface area covered, that the power density of the circuit is quite high. Therefore, they must dissipate a relatively large amount of heat through a relatively small surface area. If this heat is not dissipated, the circuit can be destroyed by the heat, and in being destroyed, the integrated circuit can damage other components as well.

Integrated circuits are typically packaged before they are used with other components as parts of larger electronic systems. The packages provide electrical connections to the contact areas of the integrated circuit, and also provide protection for the fragile circuit. Since the package encapsulating the integrated circuit completely surrounds the device, it must provide for some method of heat dissipation, or it will add to the problem of heat retention in the device.

Surface mount technology packages are especially preferred in manufacturing because of their size, cost, and weight. A surface mount package is designed to be attached, usually by solder or conductive epoxy, directly to the circuit board in which the integrated circuit is to be used. Surface mount packages eliminate the extra steps associated with attaching a socket to the circuit board, and then inserting a packaged device into the socket. Obviously, by eliminating the socket itself, the size, weight, and cost of the socket are also eliminated.

However, surface mount packages can be very difficult, if not impossible, to reconfigure after attachment to the circuit board. For instance, if after attachment to the circuit board it is discovered that a different package is required for a socketed device, the device may simply be removed from the socket, and a new device, in a preferable package, inserted in its place. With a surface mount package, the option to remove the device itself from the circuit board no longer exists, as there are no separable components that can be removed without unsoldering the package from the board. Such a rework operation may well create more problems than it will fix, by damaging the other circuits on the board, the device being removed, or both.

One situation in which reconfiguring a device's package may be desirable is when the circuit board is to be placed in an environment which was not foreseen at the time that the package was attached to the circuit board. For instance, a package that was designed for a relatively cool environment may be wholly inadequate for a warmer environment, where a package with fins or other heat sink type apparatus would be more appropriate. Further, even if a finned package is used on the circuit board, the direction in which the fins are oriented may be transverse to the flow of air within the environment, thus reducing the effectiveness of the heat transfer from the fins to the circulating air.

While these would not be difficult problems to overcome with a socketed device, they are quite difficult to resolve for a surface mounted package. One solution to this situation would be to build a given circuit board in several different configurations, each optimized for a different environment in which the board may be used. However, the expense to manufacture and inventory of several versions of the same circuit is cost prohibitive for many applications. Typically then, manufacturers have had to either use socketed devices, with their attendant expense and other drawbacks, or accept the reality of the reduced service life that accompanies overheated surface mount devices.

What is needed, therefore, is a surface mount package for an integrated circuit that provides the benefits of reduced cost, size, and weight, but is also reconfigurable after attachment to a circuit board. The surface mount package should individualize and optimize the heat dissipation characteristics of the package to the temperature and air flow conditions of the environment in which the circuit board may be used.

SUMMARY OF THE INVENTION

The above and other needs are met by a configurable package for mounting an integrated circuit to a circuit board. The package has a substrate configured for receiving the integrated circuit. On the substrate are contacts for making electrical connections between the substrate and the integrated circuit. The substrate also has solder balls for making electrical connections between the substrate and the circuit board. An electrical connection is provided between each one of the contacts and one of the solder balls. In this manner the substrate provides for electrical connection between the integrated circuit, which is received on the upper surface of the substrate and the circuit board. In one embodiment, the circuit board is attached to the lower surface of the substrate. In an alternate embodiment the circuit board is attached to a different portion of the upper surface of the substrate, in a manner well known in the art.

A clip ring/dam ring overlays and attaches, preferably by adhesive bonding, to the substrate. The clip ring/dam ring is configured to form a reservoir for receiving the integrated circuit on the substrate. Also formed on the clip ring/dam ring, preferably at the periphery, are clamping tabs. If the device is to be used in a relatively cool environment, the integrated circuit is mounted in the reservoir and the reservoir can be filled with an encapsulating material, such as epoxy, to complete the package. If the device is to be used in a warmer environment, then a lid is provided for covering the integrated circuit and reservoir. Such a lid would preferably be made of a heat dissipative material. One or more clips overlay the lid and releasably attach to the clamping tabs of the clip ring/dam ring, and retain the lid to the clip ring/dam ring. Alternately, the clip or clips are integrated into the lid.

In an even warmer environment, the lid may have fins formed in it, to act as a heat sink, and dissipate heat to the air flowing within the environment. Because the clip may be released from the clip ring/dam ring, a lid without fins may be replaced with a lid having fins, should the circuit board be placed in a different environment, or a finned lid can be reoriented so as to make the most efficient use of the air circulation within the environment. In such a case, the tabs formed on the clip ring/dam ring are spaced and configured to attach to the clip and lid (or heat sink) when the clip or lid are in different orientations. Preferably, the lid or heat sink is mountable in at least two positions, with one position being rotated ninety degrees with respect to the other. Most preferably the lid may be oriented to an infinite number of angular positions.

3

BRIEF DESCRIPTION OF THE DRAWINGS

Further advantages of the invention will become apparent by reference to a detailed description of preferred embodiments, particularly when considered in conjunction with the following drawings. In the drawings like reference numerals denote like elements throughout the several views.

DETAILED DESCRIPTION OF THE INVENTION

Figure 1A:
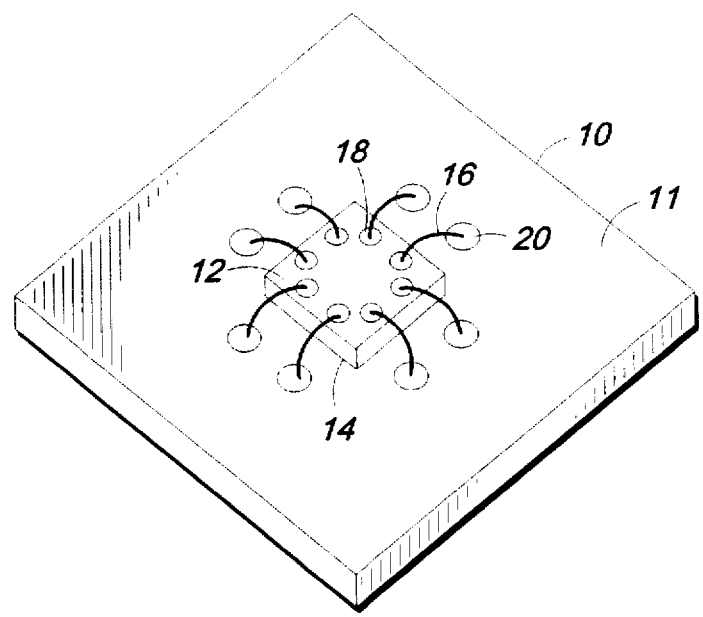
FIG. 1A is a somewhat diagrammatic perspective view of an integrated circuit attached to the upper surface of a substrate, showing the bonding wires.

Referring now to FIG. 1A there is depicted a substrate 10, to which there is attached an integrated circuit 12. The integrated circuit 12 is commonly attached with an adhesive 14, such as an epoxy, to the upper surface 11 of the substrate 10, so that the integrated circuit 12 is immovably attached to the substrate 10. Bonding wires 16 are used to make electrical connection between the first connector means or bonding pads 18 of the integrated circuit 12 and the contacts 20 of the substrate 10. As depicted in FIG. 1A there are only eight sets of bonding pads 18, bonding wires 16, and contacts 20. In a typical configuration, however, there may be many more such sets present, but for the sake of clarity in the drawings, only eight sets are depicted.

Figure 1B:
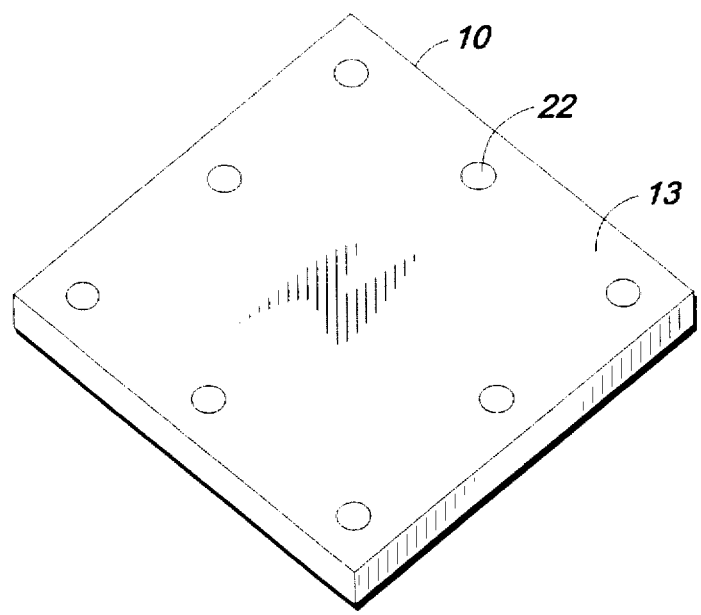
FIG. 1B is a somewhat diagrammatic perspective view of the lower surface of the substrate, showing the solder balls.

The lower surface 13 of the substrate is depicted in FIG. 1B, and shows second connector means or solder balls 22.

One of each of the solder balls 22 is electrically connected by an electrical path with one each of the contacts 20 on the upper surface 11 of the substrate 10, depicted in FIG. 1A. Thus, electrical contact can be made from the solder balls 22 to the bonding pads 18 of the integrated circuit 12. The solder balls 22 are preferably disposed in a grid-like arrangement about the periphery of the lower surface 13 of the substrate 10. Because so few of the solder balls 22 are depicted, they are quite spread out in this view. However, in a typical configuration there may be several hundred solder balls 22 placed quite close to each other, preferably disposed in several concentric rectangular rings inside the periphery of the substrate 10.

Because of the arrangement of the solder balls 22, this type of package configuration is referred to as a ball grid array package. The substrate 10 acts to some degree as a heat sink to help cool the integrated circuit 12, and also provides a convenient method of making electrical contact between the bonding pads 18 and the other components that will be used with the integrated circuit 12. The substrate 10 must be of sufficient rigidity to prevent excessive flexing of the integrated circuit 12, which would cause the integrated circuit 12 to detach from the substrate 10 by breaking the adhesive 14, or may even crack the integrated circuit 12.

This rigidity is typically provided by using thicker layers of inexpensive materials, such as thermoplastic resins, or more expensive materials, such as ceramics. As the ceramics tend to be somewhat brittle, thicker layers of ceramic are required to ensure the structural stability of the substrate 10. The present invention provides for the use of thinner substrates 10, by providing for the required rigidity in another manner, as described more fully below.

Figure 2A:
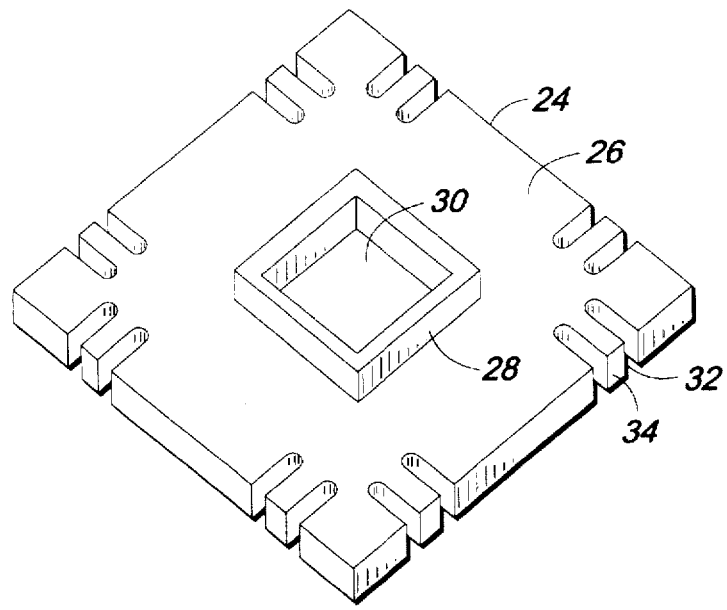
FIG. 2A is a perspective view of the upper surface of a clip ring/dam ring.
Figure 2B:
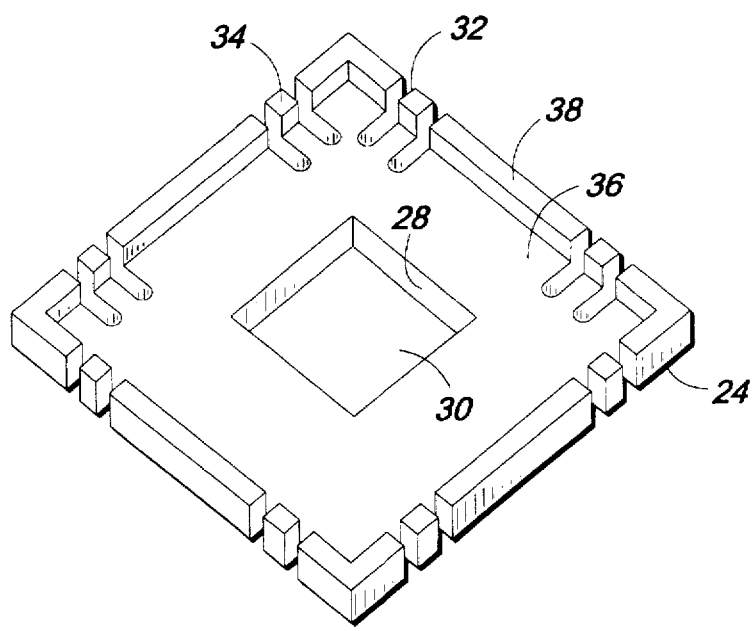
FIG. 2B is a perspective view of the lower surface of a clip ring/dam ring.
Figure 2C:
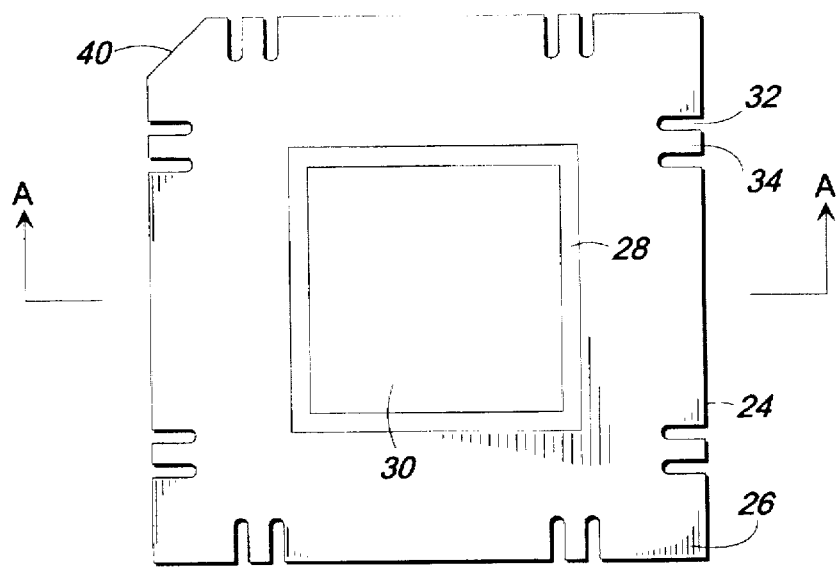
FIG. 2C is a top plan view of the clip ring/dam ring, showing the clamping tabs.
Figure 2D:
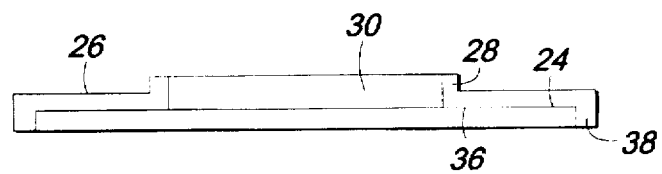
FIG. 2D is a cross-sectional view of the clip ring/dam ring.

In FIG. 2A there is depicted a clip ring/dam ring 24. On the upper surface 26 of the clip ring/dam ring 24 is formed a rectangular dam ring 28, which has the form of up-turned lips and which defines a center void or reservoir 30. Formed at the periphery of clip ring/dam ring 24 are slots 32, defining attachment members or clamping tabs 34, the purpose of which will be explained in greater detail below. The lower surface 36 of the clip ring/dam ring 24 is depicted in FIG. 2B, and shows retaining lip 38 which has the form of down-turned lips, the inside surface of dam ring 28, and the reservoir 30. Also visible are the lower surfaces of the clamping tabs 34, which form an angle with the retaining lip 38. FIG. 2C is a top plan view of the clip ring/dam ring 24, and shows a preferable flat 40 which may aid in orienting the package when mounted on a circuit board. FIG. 2D is a cross-sectional view of the clip ring/dam ring 24 along line A—A of FIG. 2C.

Figure 3A:
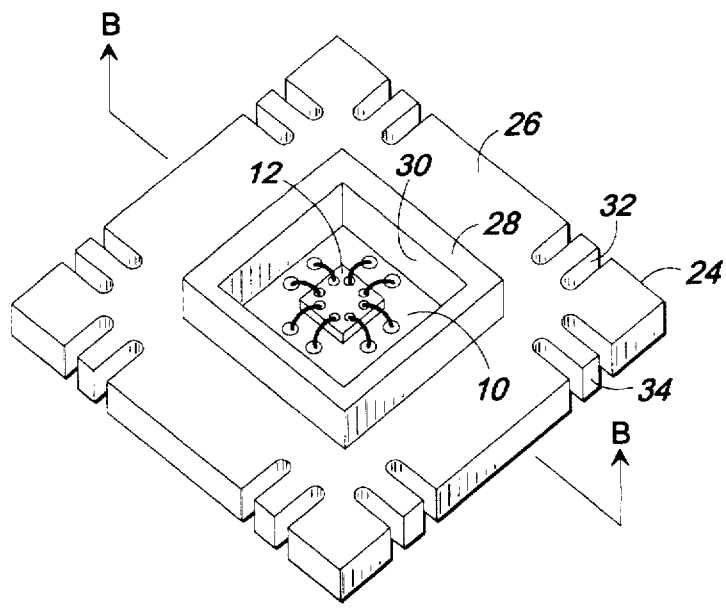
FIG. 3A is a somewhat diagrammatic perspective view of the integrated circuit as mounted to the substrate, with the clip ring/dam ring overlaying the substrate.
Figure 3B:
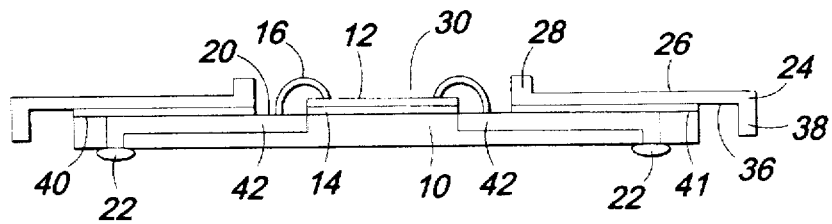
FIG. 3B is a somewhat diagrammatic cross-sectional view of the integrated circuit, substrate, and clip ring/dam ring.

The clip ring/dam ring 24 is preferably made of a relatively inexpensive material, such as copper or a high temperature, light-weight plastic, or any other material that is heat conductive and rigid. The clip ring/dam ring 24 is placed over the substrate 10 as depicted in FIG. 3A. The integrated circuit 12 is received by and situated within the reservoir 30 formed by the damn ring 28. FIG. 3B shows a cross-section of the structure of FIG. 3A along line B—B, and provides a view of the adhesive 14 which is used to attach the integrated circuit 12 to the substrate 10. Also visible are the interconnect means or connections 42 which connect the contacts 20 to the solder balls 22.

The lower surface 36 of the clip ring/dam ring 24 is attached to the upper surface 11 of the substrate 10, such as by an adhesive 41. The clip ring/dam ring 24 may, as shown, also overhang the substrate 10 at the periphery of the structures. The retaining lip 38 of the clip ring/dam ring 24 hangs down below the upper surface 11 of the substrate 10. In the preferred embodiment, the entire retaining lip 38 does not hang down as far as the lower surface 13 of the substrate 10. In alternate embodiments, portions of the retaining lip 38 do hang down past the lower surface 13 of the substrate 10, to a depth such that the weight of the completed package will not adversely affect the mounting of the package to a circuit board, as explained in more detail below.

Because the clip ring/dam ring 24 is rigid, the substrate 10 is not required to provide rigidity to the completed package, and may thus be fashioned of thinner materials, and from a wider variety of materials, which may be chosen for their other attributes, such as cost, heat conductance, and ease of manufacture, rather than rigidity.

Figure 3C:
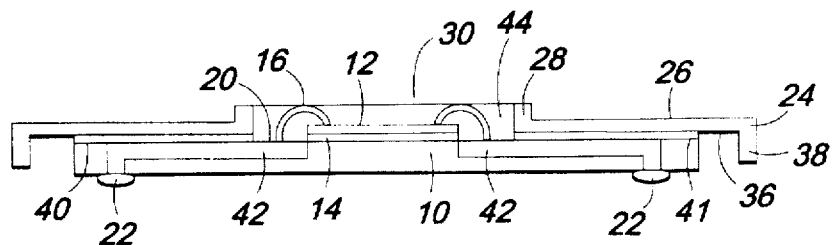
FIG. 3C is a cross-sectional view of the integrated circuit, substrate, and clip ring/dam ring, with an epoxy seal.

If the integrated circuit 12 is to be used in an environment where adequate heat dissipation from the device will not be a problem, the reservoir 30 can be filled with an encapsulating material, such as epoxy 44, as depicted in FIG. 3C. The dam ring 28 keeps the epoxy 44 in the reservoir 30, and prevents the spread of the epoxy 44 to other portions of the package. When the epoxy 44 is cured, the package is completed, and ready for surface mounting to a circuit board.

Figure 4A:
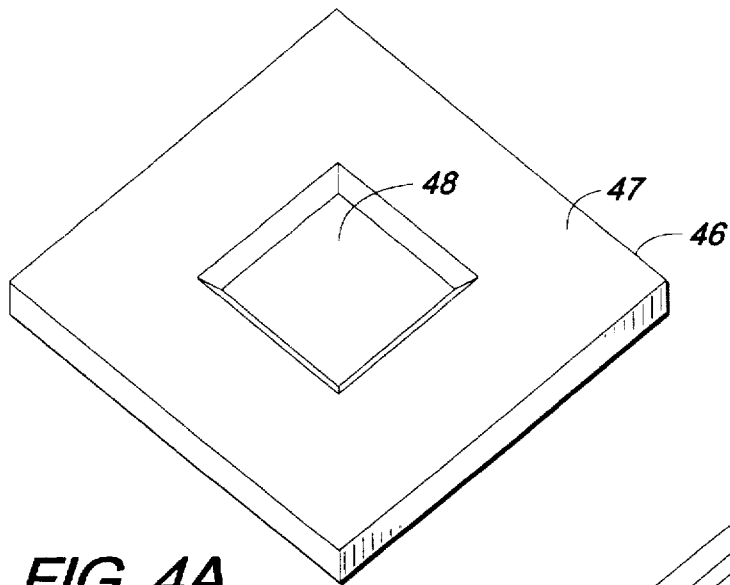
FIG. 4A is a perspective view of the upper surface of a lid.
Figure 4B:
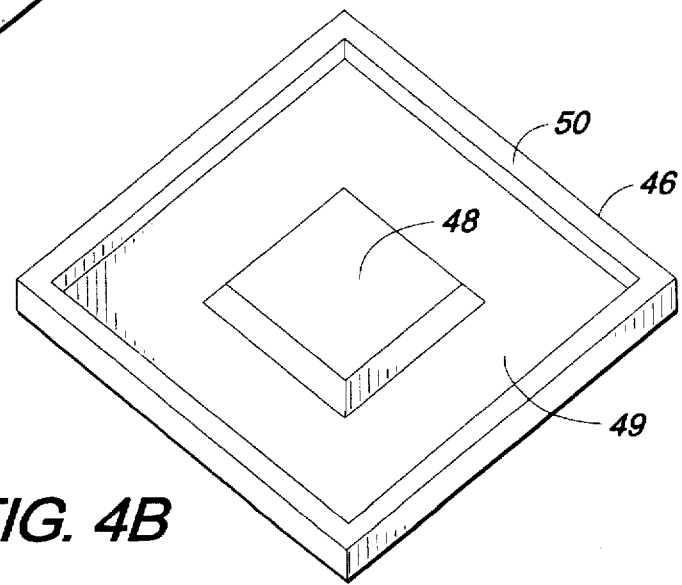
FIG. 4B is a perspective view of the lower surface of the lid.

If the integrated circuit 12 is to be used in a warmer environment, where heat dissipation will be more of a consideration and an epoxy encapsulation may not provide sufficient cooling for the device, a lid 46, such as that depicted in FIGS. 4A and 4B, can be used to protect the integrated circuit 12. The lid 46 preferably forms a recess 48, to reduce air volume within the reservoir 30 when the lid 46 is attached to the clip ring/dam ring 24. FIG. 4B shows side wall 50 of the lid 46. The lid 46 is preferably made of a heat dissipative material such as metal, ceramic, or plastic.

The lid 46 efficiently conducts heat from the lower surface 49 of the lid 46, which is nearer the integrated circuit 12, to the upper surface 47 of the lid 46, which is on the outside of the package. In a preferred embodiment a compliant, thermally conductive compound, such as thermal grease, may be placed between the integrated circuit 12 and the lower surface 49 of the lid 46, so as to provide for enhanced heat exchange between the integrated circuit 12 and the lid 46.

Figure 4C:
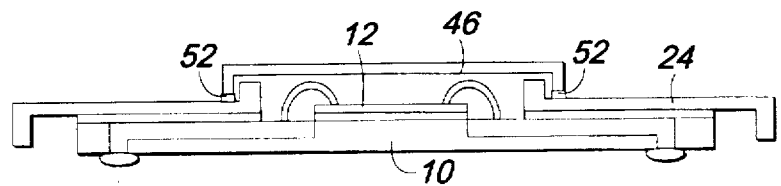
FIG. 4C is a diagrammatic cross-sectional view of the integrated circuit, substrate, clip ring/dam ring, and lid.

The lid 46, depicted in cross-section in FIG. 4C in an alternate embodiment without a recess 48, overlays the clip ring/dam ring 24 and may be attached to the clip ring/dam ring 24 such as by an adhesive 52 between the side walls 50 of the lid 46 and the upper surface 26 of the clip ring/dam ring 24. However, if the lid 46 is attached by adhesive 52, then the lid 46 will not be able to be removed from the clip ring/dam ring 24 at a later time. If the temperature and air flow properties of the environment in which the device will be used are known, and will not change, then this is an acceptable method of attaching the lid 46. This embodiment still provides the benefit of using a less rigid and less expensive substrate 10, because of the use of the clip ring/dam ring 24.

Figure 4D:
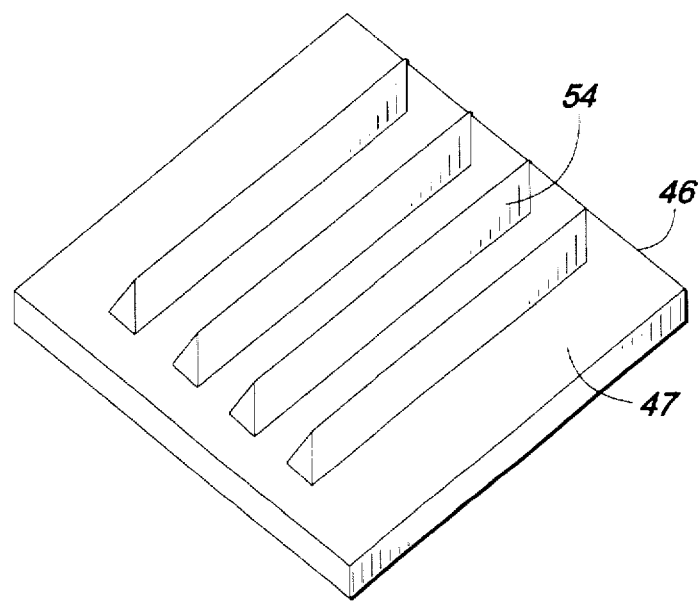
FIG. 4D is a perspective view of the upper surface of a lid having fins.

If it is possible that the device will be used in a still warmer environment, then a lid 46 such as that depicted in FIG. 4D may be used. In this embodiment, lid 46 has a plurality of fins 54 formed on the upper surface 47. The lid 46 and fins 54 act as a heat sink to the integrated circuit 12, providing an increased surface area through which the heat received by the lid 46 and fins 54 can be radiated and convected away from the device.

Figure 4E:
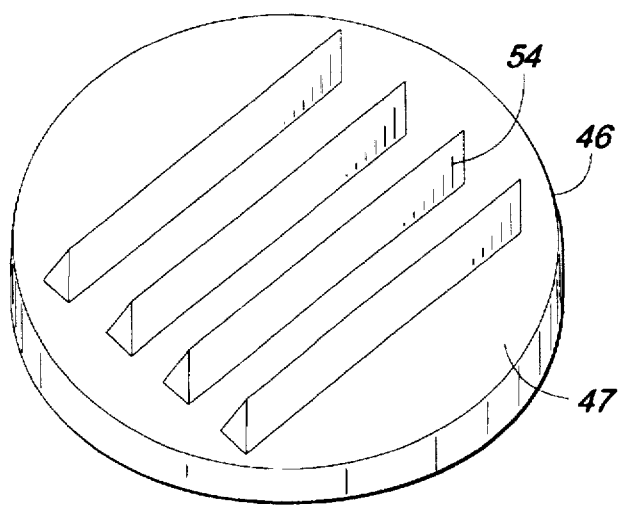
FIG. 4E is a perspective view of the upper surface of a circular lid having fins.

The lid 46 is preferably formed in a symmetrical fashion, such as in a square, as depicted in FIG. 4D, or a circle, as depicted in FIG. 4E, so that the fins 54 can be oriented in a direction that will optimize the transfer of heat to the air within the environment wherein the package will be placed. For a lid 46 with a square configuration, the fins 54 may be oriented in one of two different directions. For a lid 46 with a circular configuration, the fins 54 may be oriented in any number of different directions. Orienting the fins 54 to the direction of air flow within the environment is important, as optimum heat transfer will only occur when the fins 54 are oriented such that the air flows down the length of the fins 54. Air flow transverse to the fins 54 will decrease the efficiency of heat transfer.

Figure 5A:
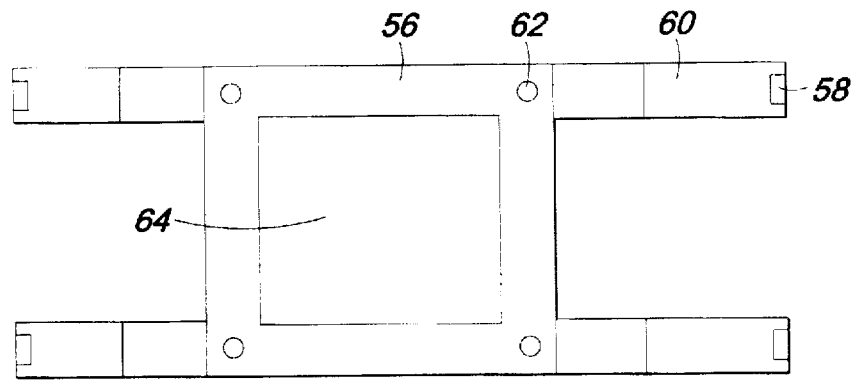
FIG. 5A is a top plan view of a clip.

If the temperature and air patterns of the environment in which the device is to be used are not known, then it would not be preferable to use the adhesive 52 to attach any particular lid 46, because it would not be known whether a finned or unfinned lid 46 would be required, or even in what direction to orient the fins 54, if present. Therefore, another means of attaching the lid 46 is employed. In FIG. 5A, for example, there is depicted a clip 56, having hooks 58 at the end of flextures 60. Also visible are compression points 62, and cut-out 64.

Figure 5B:
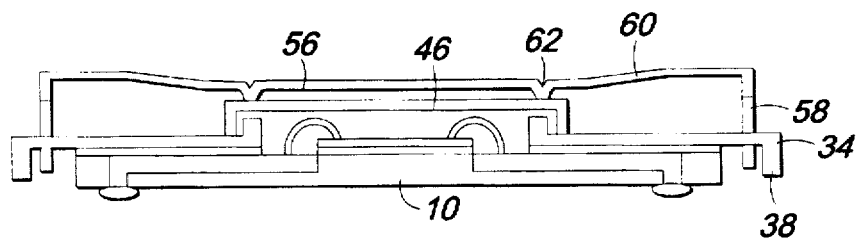
FIG. 5B is a cross-sectional view of the integrated circuit, substrate, clip ring/dam ring, lid, and clip.

As shown in FIG. 5B, the clip 56 is attached to the clip ring/dam ring 24 and retains the lid 46 to the clip ring/dam ring 24. The hooks 58 engage the clamping tabs 34 of the clip ring/dam ring 24, and are kept from slipping off by the retaining lip 38. The flextures 60 of the clip 56 provide tension to the hook 58/tab 34 assembly, to keep them engaged. The flextures 60 also provide compression through the compression points 62 to the lid 46, retaining it against the clip ring/dam ring 24.

Because the flextures 60 can be repeatedly compressed, the clip 56 can be removed as required to replace, for example, a plain lid 46 with a lid 46 having fins 54, should the temperature of the environment change. Further, the fins 54 of a lid 46 can be reoriented at any time, by removing the clip 56, reorienting the lid 46, and thereby the fins 54, and replacing the clip 56. The cut-out 64 allows the fins 54 of the lid 46 to extend through the clip 56. Thus the clip 56 does not preclude the use of a finned lid 46, or inhibit the air flow through the fins 54.

Another advantage of the present invention is realized because the clip 56 is removable. In some circumstances the weight of the finned lid 46 impairs the process of mounting the device to the circuit board. Because the finned device weighs more than a device without fins, the solder balls 22 may flatten excessively during the mounting process. This can result in reduced adhesion between the package and the circuit board, or in electrical bridging between the solder balls 22, if they flatten to the extent that they make contact one with another.

However, if portions of the retaining lip 38 hang down past the lower surface 13 of the substrate 10 as explained above, then the weight of the completed package is less of a consideration, as the retaining lip 38 will prevent the weight of the completed package from impairing the mounting of the package to the circuit board. In addition, because the clip 56 and finned lid 46 are removable, the finned lid 46 can be removed during the mounting process, and then replaced on the package when the mounting process is completed.

Figure 6A:
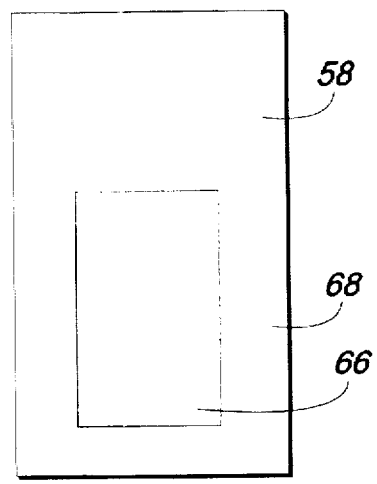
FIG. 6A is an end view of the clip showing the detail of a hook.
Figure 6B:
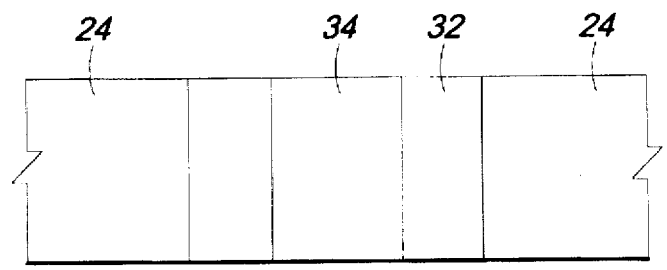
FIG. 6B is an edge view of the clip ring/dam ring showing the detail of a clamping tab.
Figure 6C:
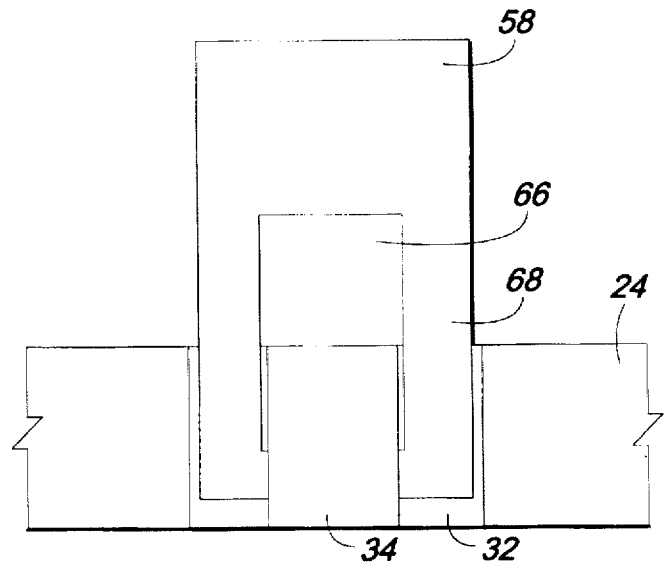
FIG. 6C is an edge view of the clip ring/dam ring, showing the detail of a hook engaging a clamping tab.

In FIG. 6A there is depicted an end view of one of the hooks 58 of the clip 56, showing slot 66 and side members 68. FIG. 6B depicts the edge of the clip ring/dam ring 24, showing the detail of a clamping tab 34. FIG. 6C depicts in greater detail how clamping tab 34 engages and retains hook 58. The slot 66 of the hook 58 has a width and depth sufficient to receive clamping tab 34. The slots 32 of the clip ring/dam ring 24 are sufficiently wide to receive the side members 68 of hook 58. After the clamping tab 34 is inserted through the slot 66 of hook 58, hook 58 is raised up by flextures 60 (not depicted), and held in place by retaining lip 38 (not depicted).

While preferred embodiments of the present invention are described above, it will be appreciated by those of ordinary skill in the art that the invention is capable of numerous modifications, rearrangements and substitutions of parts without departing from the spirit of the invention, such as by using the invention with various package types, such as enhanced plastic ball grid array packages, ceramic ball grid array packages, and tape ball grid array packages. Additionally, the invention is equally applicable to packages designed for either wire-bonded or flip-chip semiconductor devices.

What is claimed is:

1. A configurable package for mounting an integrated circuit to a circuit board comprising:
   a substrate for receiving the integrated circuit, the substrate having contacts for making electrical connections between the substrate and the integrated circuit, and solder balls for making electrical connections between the substrate and the circuit board, each one of the contacts being in electrical contact with one of the solder balls, and
   a clip ring/dam ring for overlaying and attaching to the substrate to stiffen and reinforce the substrate, the clip ring/dam ring forming a reservoir for receiving the integrated circuit on the substrate, the clip ring/dam ring forming attachment members for making attachments thereto.

2. The package of claim 1 further comprising an epoxy seal situated within the reservoir of the clip ring/dam ring for protecting the integrated circuit.

3. The package of claim 1 wherein the attachment members comprise tabs formed at the periphery of the clip ring/dam ring.

4. The package of claim 1 further comprising:
   a lid for covering the integrated circuit received and the reservoir formed by the substrate and the clip ring/dam ring, and
   a clip for releasably attaching the lid to the attachment members of the clip ring/dam ring, and for retaining the lid to the clip ring/dam ring thereby.

5. The package of claim 4 wherein the lid further comprises a heat dissipative material.

6. The package of claim 4 wherein the lid has fins formed therein.

7. The package of claim 4 wherein the clip further comprises:
   hooks for engaging the attachment members of the clip ring/dam ring,
   compression points for receiving the lid covering the integrated circuit, and
   flextures disposed between the hooks and the compression points, for providing compression at the compression points, and for providing tension at the hooks.

8. The package of claim 4 wherein:
   the lid further comprises;
     a lower surface disposed adjacent the clip ring/dam ring,
     an upper surface disposed opposite the lower surface, and
     fins disposed on the upper surface, for receiving heat from the lid and dissipating the heat so received, and;
   the clip further comprises;
     hooks for engaging the attachment members of the clip ring/dam ring,
     compression points for receiving the upper surface of the lid,
     flextures disposed between the hooks and the compression points, for providing pressure at the compression points, and for providing tension at the hooks, and
   a cut-out formed in the clip, for allowing the fins disposed on the upper surface of the lid to extend through the clip.

9. The package of claim 4 wherein the lid is rotatable to a plurality of different positions in respect to the clip ring/dam ring.

10. The package of claim 4 further comprising an integrated circuit disposed between the substrate and the lid and having electrical connection to the contacts of the substrate.

11. The package of claim 1 wherein the clip ring/dam ring further comprises:
   down-turned lips at the periphery of the clip ring/dam ring,
   slots at the periphery of the clip ring/dam ring, which define tabs incorporating the down-turned lips,
   a center void defined by up-turned interior lips for forming the reservoir,
   the clip ring/dam ring having a greater circumference than the substrate, and extending outwardly over the substrate, with the tabs disposed beyond the periphery of the substrate, and
   the down-turned lips on the tabs disposed above the circuit board on which the substrate is mounted.

12. A package according to claim 1 further comprising a semiconductor device mounted to the substrate.

13. A clip ring/dam ring for a ball grid array package having a dam ring for forming a reservoir, for receiving an integrated circuit, and slots forming clamping tabs at the periphery of the clip ring/dam ring for making clamping connections thereto.

14. The clip ring/dam ring of claim 13 further comprising:
   down-turned lips at the periphery of the clip ring/dam ring, and
   the dam ring defined by up-turned interior lips for forming the reservoir.

15. A configurable package for mounting an integrated circuit to a circuit board comprising:
   substrate means having a top surface and an opposing bottom surface, for receiving the integrated circuit,
   first connector means disposed on the top surface of the substrate means, for making electrical connections between the substrate means and an integrated circuit,
   second connector means disposed on the bottom surface of the substrate means, for making electrical connections between the substrate means and the circuit board,
   interconnect means disposed within the substrate means, for making electrical connections between the first connector means and the second connector means,
   clip ring/dam ring means attached to the top surface of the substrate means, for stiffening the substrate means,
   reservoir means formed within the clip ring/dam ring means, for receiving the integrated circuit, and
   attachment means formed on the clip ring/dam ring means, for making attachments thereto.

16. The package of claim 15 further comprising:

lid means for covering the integrated circuit received by the reservoir means, and clip means for releasably attaching the lid means to the attachment means, and for retaining the lid to the clip ring/dam ring means thereby.

17. The package of claim 15 further comprising:

lid means for covering the integrated circuit received by the reservoir means, the lid means having;
- a lower surface disposed adjacent the clip ring/dam ring means,
- an upper surface disposed opposite the lower surface, and
- heat dissipation means disposed on the upper surface, for receiving heat from the lid means and dissipating the heat so received; and clip means for releasably attaching the lid means to the attachment means, and for retaining the lid to the clip ring/dam ring means thereby, the clip means having;
- hook means for engaging the attachment means, compression point means for receiving the upper surface of the lid means,
- flexture means disposed between the hook means and the compression point means, for providing compression at the compression points, and for providing tension at the hook means, and
- cut-out means formed in the clip means, for allowing the heat dissipation means on the upper surface of the lid means to extend through the clip means.

18. The package of claim 15 wherein the clip ring/dam ring means further comprises:
- down-turned lip means disposed in a down-turned fashion at the periphery of the clip ring/dam ring means,
- slot means at the periphery of the clip ring/dam ring means, which, together with the first lip means, define the attachment means,
- up-turned lip means disposed in an up-turned fashion at the interior of the clip ring/dam ring means, for defining the reservoir means,
- the clip ring/dam ring means having a greater circumference than the substrate means, and extending outwardly over the substrate, with the attachment means disposed beyond the periphery of the substrate means, and
- the down-turned lip means on the attachment means disposed above the circuit board on which the substrate means is mounted.

19. A configurable package for mounting an integrated circuit to a circuit board comprising:

a substrate for receiving the integrated circuit, the substrate having contacts for making electrical connections between the substrate and the integrated circuit, and solder balls for making electrical connections between the substrate and the circuit board, each one of the contacts being in electrical contact with one of the solder balls, and a clip ring/dam ring for overlaying and attaching to the substrate to stiffen and reinforce the substrate, the clip ring/dam ring forming a reservoir for receiving the integrated circuit on the substrate, the clip ring/dam ring forming attachment members for making attachments thereto, the clip ring/dam ring having;
- down-turned lips at the periphery of the clip ring/dam ring,
- slots at the periphery of the clip ring/dam ring, which define tabs incorporating the down-turned lips,
- a center void defined by up-turned interior lips for forming the reservoir,
- the clip ring/dam ring having a greater circumference than the substrate, and extending outwardly over the substrate, with the tabs disposed beyond the periphery of the substrate, and
- the down-turned lips on the tabs disposed above the circuit board on which the substrate is mounted;

an epoxy seal situated within the reservoir of the clip ring/dam ring for protecting the integrated circuit, a lid for covering the integrated circuit received and the reservoir formed by the substrate and the clip ring/dam ring, the lid formed of a heat dissipative material, and having;
- a lower surface disposed adjacent the clip ring/dam ring,
- an upper surface disposed opposite the lower surface, and
- fins disposed on the upper surface, for receiving heat from the lid and dissipating the heat so received; and a clip for releasably attaching the lid to the attachment members of the clip ring/dam ring, and for retaining the lid to the clip ring/dam ring thereby, the clip having;
- hooks for engaging the attachment members of the clip ring/dam ring,
- compression points for receiving the upper surface of the lid,
- flextures disposed between the hooks and the compression points, for providing compression at the compression points, and for providing tension at the hooks, and
- a cut-out formed in the clip, for allowing the fins disposed on the upper surface of the lid to extend through the clip.

* * * * *